US012622051B2

(12) United States Patent (10) Patent No.: US 12,622,051 B2
Ferrer et al. (45) Date of Patent: May 5, 2026

(54) FIELD EFFECT TRANSISTOR HIGH ASPECT RATIO PATTERNING

(71) Applicant: INTERNATIONAL BUSINESS MACHINES CORPORATION, Armonk, NY (US)

(72) Inventors: Domingo Ferrer, Clifton Park, NY (US); Wai Kin Li, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 476 days.

(21) Appl. No.: 18/193,240

(22) Filed: Mar. 30, 2023

(65) Prior Publication Data

US 2024/0332295 A1 Oct. 3, 2024

(51) Int. Cl.
| | |
|---|---|
| *H10D 84/85* | (2025.01) |
| *H10D 30/01* | (2025.01) |
| *H10D 30/43* | (2025.01) |
| *H10D 30/67* | (2025.01) |
| *H10D 62/10* | (2025.01) |
| *H10D 84/01* | (2026.01) |
| *H10D 84/03* | (2025.01) |
| *H10W 20/20* | (2026.01) |

(52) U.S. Cl.
CPC ........... *H10D 84/85* (2025.01); *H10D 30/014* (2025.01); *H10D 30/43* (2025.01); *H10D 30/6735* (2025.01); *H10D 30/6757* (2025.01); *H10D 62/121* (2025.01); *H10D 84/0167* (2025.01); *H10D 84/0186* (2025.01); *H10D 84/038* (2025.01); *H10W 20/20* (2026.01)

(58) Field of Classification Search
None
See application file for complete search history.

(56) References Cited

U.S. PATENT DOCUMENTS

| | | | |
|---|---|---|---|
| 9,768,118 B1 * | 9/2017 | Li | ..................... H01L 21/76897 |
| 10,002,932 B2 | 6/2018 | Xie | |
| 10,804,148 B2 | 10/2020 | Fan | |
| 10,944,013 B2 | 3/2021 | Xu | |
| 11,133,310 B2 | 9/2021 | Fulford | |
| 11,201,152 B2 | 12/2021 | Xie | |
| 11,227,917 B1 | 1/2022 | Chung | |
| 11,362,091 B2 | 6/2022 | Fulford | |
| 11,444,082 B2 | 9/2022 | Smith | |
| 2012/0032274 A1 * | 2/2012 | Erickson | ................ H10D 88/00 |
| | | | 438/234 |
| 2018/0337277 A1 | 11/2018 | Bao | |
| 2019/0393306 A1 | 12/2019 | Zhang | |
| 2021/0028169 A1 * | 1/2021 | Smith | ................ H10D 84/0177 |

FOREIGN PATENT DOCUMENTS

| | | |
|---|---|---|
| TW | 691079 B | 4/2020 |
| WO | 2022130451 A1 | 6/2022 |

* cited by examiner

*Primary Examiner* — Bo B Jang
(74) *Attorney, Agent, or Firm* — Kimberly Zillig

(57) ABSTRACT

A semiconductor device integrated circuit includes a semiconductor wafer, an insulator on the wafer, a first field effect transistor (FET) positioned in the insulator, a second FET positioned in the insulator between the wafer and the first FET, a pore in the insulator that extends to the second FET, a via that is electrically connected to the second FET and positioned in the pore, and a liner positioned between the via and the pore. The first FET is electrically insulated from the via by the liner.

10 Claims, 8 Drawing Sheets

100

(Operation 304)

(Operation 302)

(Operation 308)

(Operation 306)

(Operation 312)

(Operation 310)

(Operation 314)

FIELD EFFECT TRANSISTOR HIGH ASPECT RATIO PATTERNING

BACKGROUND

The present invention relates to semiconductor devices, and more specifically, to vias between layers in an integrated circuit.

Field-effect transistors (FETs) use an electric field effect to control current flow within a semiconductor. Specifically, FETs may use the electric charge of their gates to affect and control the current flow through a channel. One common type of FET is a finFET. FinFETs, as referred to herein, may be FETs in a vertical fin shape. FinFETs may have vertically stacked channels, and vertically stacked components in general, in order to form the tall, narrow fin shape of a finFET. Another type of FET is a nanosheet transistor, also referred to herein as a nanosheet FET. Nanosheet transistors may include horizontally stacked nanosheets, instead of the thin vertical fin of a FinFET. Each nanosheet may act as a channel, therefore nanosheet transistors may include a plurality of channels for current to flow.

FETs may have two typical configurations, N-channel FETs (NFETs) and P-channel FETs (PFETs). NFETs introduce (for example, through doping) an n-type impurity to the semiconductor material of the channel between the source and the drain, and PFETs introduce a p-type impurity to the semiconductor material of the channel. These two types of FETs can be employed in either fin configurations or nanosheet configurations.

SUMMARY

A semiconductor device integrated circuit includes a semiconductor wafer, an insulator on the wafer, a first field effect transistor (FET) positioned in the insulator, a second FET positioned in the insulator between the wafer and the first FET, a pore in the insulator that extends to the second FET, a via that is electrically connected to the second FET and positioned in the pore, and a liner positioned between the via and the pore. The first FET is electrically insulated from the via by the liner.

A method of manufacturing a semiconductor device includes forming a pore in an insulator alongside a first field effect transistor (FET), forming a liner in the pore, removing a bottom of the liner, extending the pore using an anisotropic removal process to expose a second FET, and extending the pore using another removal process to widen a portion of the pore the is below the liner and over the second FET.

A semiconductor device integrated circuit includes a semiconductor wafer, an insulator on the wafer, a first nanosheet field effect transistor (FET) positioned in the insulator, a second nanosheet FET positioned in the insulator between the wafer and the first nanosheet FET, a pore in the insulator that extends to a source/drain region of the second nanosheet FET, a liner positioned in the pore, wherein the liner is comprised of a low dielectric constant material and is shorter than the pore, and a via connected to the source/drain region of the second nanosheet FET and positioned in the pore and the liner.

DETAILED DESCRIPTION

Figure 1:
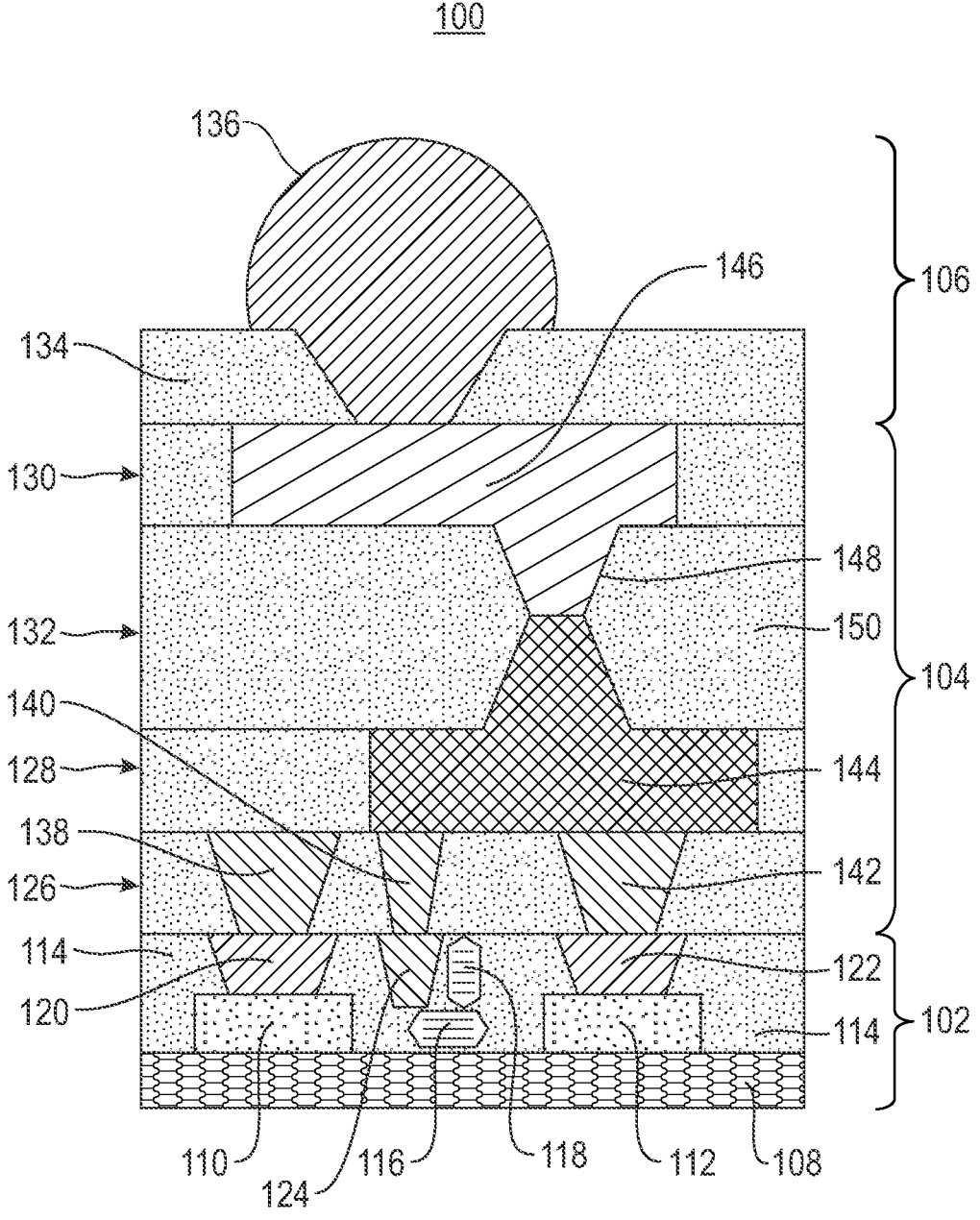
FIG. 1 is a cross-section front view of an integrated circuit (IC) chip stack, in accordance with embodiments of the present disclosure.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layers "C" and "D") are between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus. In addition, any numerical ranges included herein are inclusive of their boundaries unless explicitly stated otherwise.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography.

Deposition can be any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the wafer surface that would otherwise require higher temperatures associated with conventional CVD. Energetic ion bombardment during PECVD deposition can also improve the film's electrical and mechanical properties.

Removal/etching can be any process that removes material from the wafer. Examples include etch processes (either wet or dry), chemical mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping can be the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography can be the formation of three-dimensional relief images or patterns on the semiconductor substrate for subsequent transfer of the pattern to the substrate. In semiconductor lithography, the patterns are formed by a light sensitive polymer called a photoresist. To build complex structures that make up a transistor and the many wires that connect the millions of transistors of a circuit, lithography and etch pattern transfer steps are repeated multiple times. Each pattern being printed on the wafer is aligned to the previously formed patterns and gradually the conductors, insulators and selectively doped regions are built up to form the final device.

FIG. 1 is a cross-section front view of IC chip stack 100 (hereinafter "stack 100"). Stack 100 comprises front end of line (FEOL) portion 102, back end of line (BEOL) portion 104, and packaging portion 106. FEOL portion 102 comprises wafer 108, transistors 110, 112 (formed on wafer 108), insulator 114 (formed on wafer 108), NFET 116 (formed on wafer 108), and PFET 118 (formed in insulator 114). In addition, FEOL portion 102 comprises vias (i.e., electrical interconnects) 120, 122, 124 which are adjacent to one another and are connected to transistors 108, 110 and NFET 116, respectively. BEOL portion 104 comprises wiring layers 126, 128, 130 with insulating layer 132 in between wiring layers 128 and 130. Packaging portion 106 comprises seal layer 134 and solder bump 136.

In the illustrated embodiment, wiring layers 126, 128, 130 include lines 138, 140, 142, 144, 146, respectively, which are electrically conductive intralayer interconnects comprised of metal material(s) that extend in various directions within their respective wiring layers 126, 128, 130. For example, line 138 extends into/out of the page in FIG. 1, whereas line 146 extends across the page in FIG. 1 (although line 146 can also extend into/out of the page). Insulating layer 132 electrically insulate wiring layers 128 and 130 from each other, although via 148 is an interlayer interconnect line that extends through insulating layer 132 to connect lines 144 and 146. To insulate the electrically conductive features, FEOL portion 102 and BEOL portion 104 include dielectric material 150 therebetween (e.g., insulator 114).

Depicted in FIG. 1 is one embodiment of stack 100, to which there are alternative architectures. For example, stack 100 can have fewer or greater transistors, electrical contacts, wiring layers, and/or insulating layers. In such embodiments, the border between FEOL portion 102 and BEOL portion 104 can be at a different location (e.g., between wiring layers 126 and 128).

Figure 2:
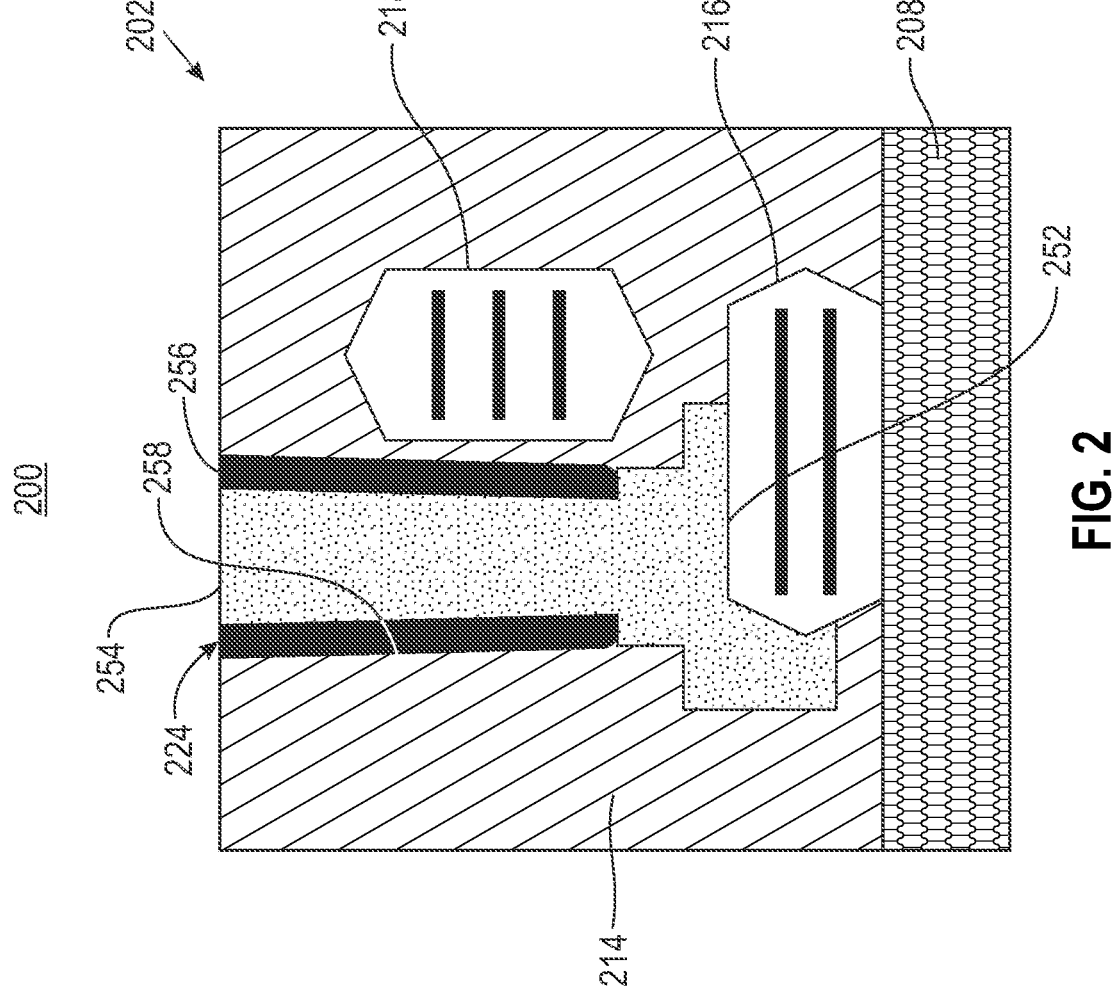
FIG. 2 is a cross-section front view of an IC chip stack, in accordance with an embodiment of the present disclosure.

FIG. 2 is a cross-section front view of IC chip stack 200 (hereinafter "stack 200"). In some embodiments, stack 200 is a portion of stack 100, so components of stack 200 that are similar to or the same as those of stack 100 have corresponding reference numerals that are one hundred greater.

In the illustrated embodiment, stack 200 comprises wafer 208, insulator 214, NFET 216, PFET 218, and electrical contact 224, all of which are positioned in FEOL portion 202 of stack 200. Insulator 214 is an electrical insulator comprised of a medium dielectric constant material (a.k.a. mid-$\kappa$), such as, for example, silicon nitride (SiN), silicon dioxide (SiO$_2$), silicon nitride carbide (SiNC), tetraethyl orthosilicate (TEOS), silicon oxycarbide (SiCO$_x$), silicon oxycarbonitride (SiCNO), or siliconboron carbonitride (SiBCN), or a mixture of one or more of the aforementioned materials. At least a portion of NFET 216 is positioned below at least a portion of PFET 218 (i.e., nearer to the wafer, not shown), and at least a portion of PFET 218 is positioned above at least a portion of NFET 216 (i.e., nearer to the BEOL portion, not shown). In other words, NFET 216 and PFET 218 at least partially overlap each other in a vertical direction, although in other embodiments, NFET 216 and PFET 218 can exchange places as they are complementary FETs). NFET 216 and PFET 218 are nanosheet FETS, and each has a source/drain location (e.g., source/drain region 252 of NFET 216).

In the illustrated embodiment, electrical contact 224 comprises via 254 and liner 256. Electrical contact 224 is a high aspect ratio feature given its higher than normal height-to-width ratio that allows for a tight pitch (i.e., small distance between features in stack 200). In some embodiments, a high aspect ratio is ten or greater, and the contact area between electrical contact 224 and NFET 216 is 20 nanometers (nm) or less. Electrical contact 224 is positioned in pore 258 in insulator 214. For example, liner 256 can be positioned in the top of pore 258 in direct contact with insulator 214, and via 254 is positioned through pore 258 in direct contact with liner 256 at the top and with insulator 214 at the bottom (since liner 256 is shorter than via 254 and only extends partway down pore 258). Liner 256 extends down to be substantially even with or below the bottom of PFET 218. Thereby, the shortest path between via 254 and PFET 218 passes through liner 256 (and, in some embodiments, insulator 214). Thus, liner 256 (and, in some embodiments, insulator 214) electrically insulates PFET 218 from via 254, which prevents an electrical short from occurring therebetween. As used herein, the term "substantially" refers to an extent to which minor deviations are included such that the deviations do not impact the desired result. Accordingly, two objects may be referred to as substantially even despite deviations, so long as those deviations do not impact the desired result of the evenness.

In the illustrated embodiment, via 254 comprises an electrically conductive material, such as metal (e.g., titanium nitride (TiN), cobalt (Co), ruthenium (Ru), molybdenum (Mo), or tungsten (W)). Liner 256 is an electrical insulator comprised of a low dielectric constant (a.k.a. low-x) such as, for example, $SiCO_x$, SiCNO, and SiBCN. Using such a low-x liner 256 can also reduce the capacitance associated with NFET 216, which improves performance. In some embodiments, liner 256 is selected based on a high selectivity of etching, for example, in operations 308 and 310 (shown in FIGS. 3, 4D, 4E). Such liner materials can include, for example, tungsten carbide (WC), silicon carbide (SiC), aluminum oxide ($Al_2O_3$), and SiN.

In the illustrated embodiment, pore 258 and via 254 are narrow at the top (although via 254 is narrower due to liner 256) and taper inward down to the bottom of liner 256. Then, pore 258 and via 254 (which begin to be the same width) widen laterally and extend between NFET 216 and PFET 218. Pore 258 and via 254 also extend downward to and partly around NFET 216. Thereby, in three-dimensions, pore 258 and via 254 are shaped as a void and solid, respectively, of revolution of an L-shape that is intersected by NFET 216. In other words, pore 258 and via 254 have shapes that are like a thinner shaft at the top that is attached to a wider disc at the bottom, which in two-dimensions looks like an inverted T-shape. However, the disc is interrupted by NFET 216 since NFET 216 will not be etched by the operation that removes insulator 214 (as described later with respect to FIGS. 3, 4D, and 4F). Thus, via 254 can be electrically connected to and directly in contact with source/drain region 252 which can be, for example, 30% to 50% of the width of the top of NFET 216. Furthermore, the area of contact between via 254 and source/drain region 252 is significantly wider than if via 254 had a continuous inward taper. Such a larger contact area lowers the electrical resistance of the joint between NFET 216 and via 254, which increases performance and decreases power consumption.

Figure 3:
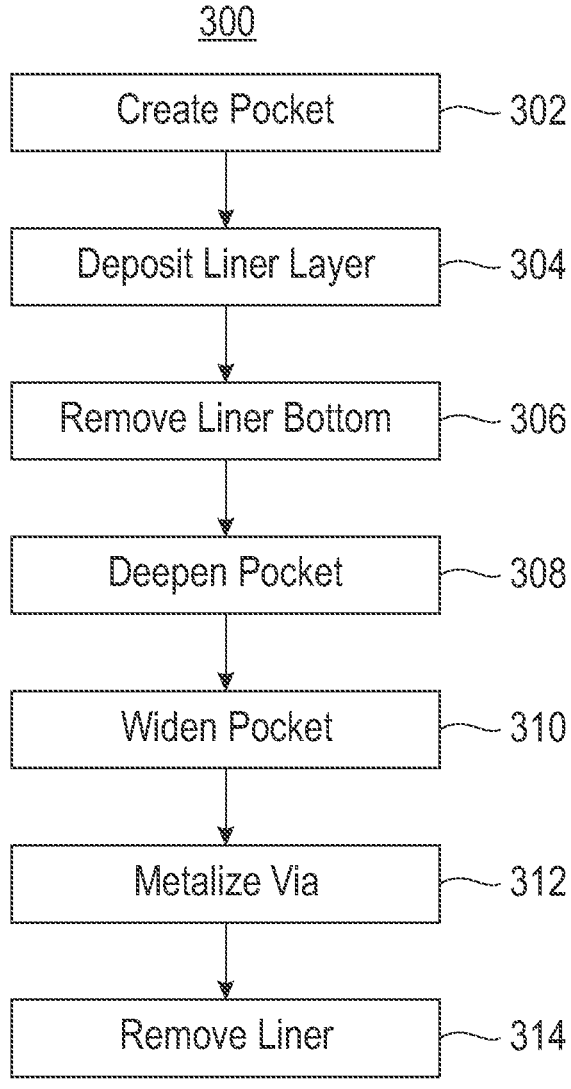
FIG. 3 is a flowchart of a method of manufacturing the IC chip stack of FIG. 2, in accordance with an embodiment of the present disclosure.
Figures 4A, 4B:
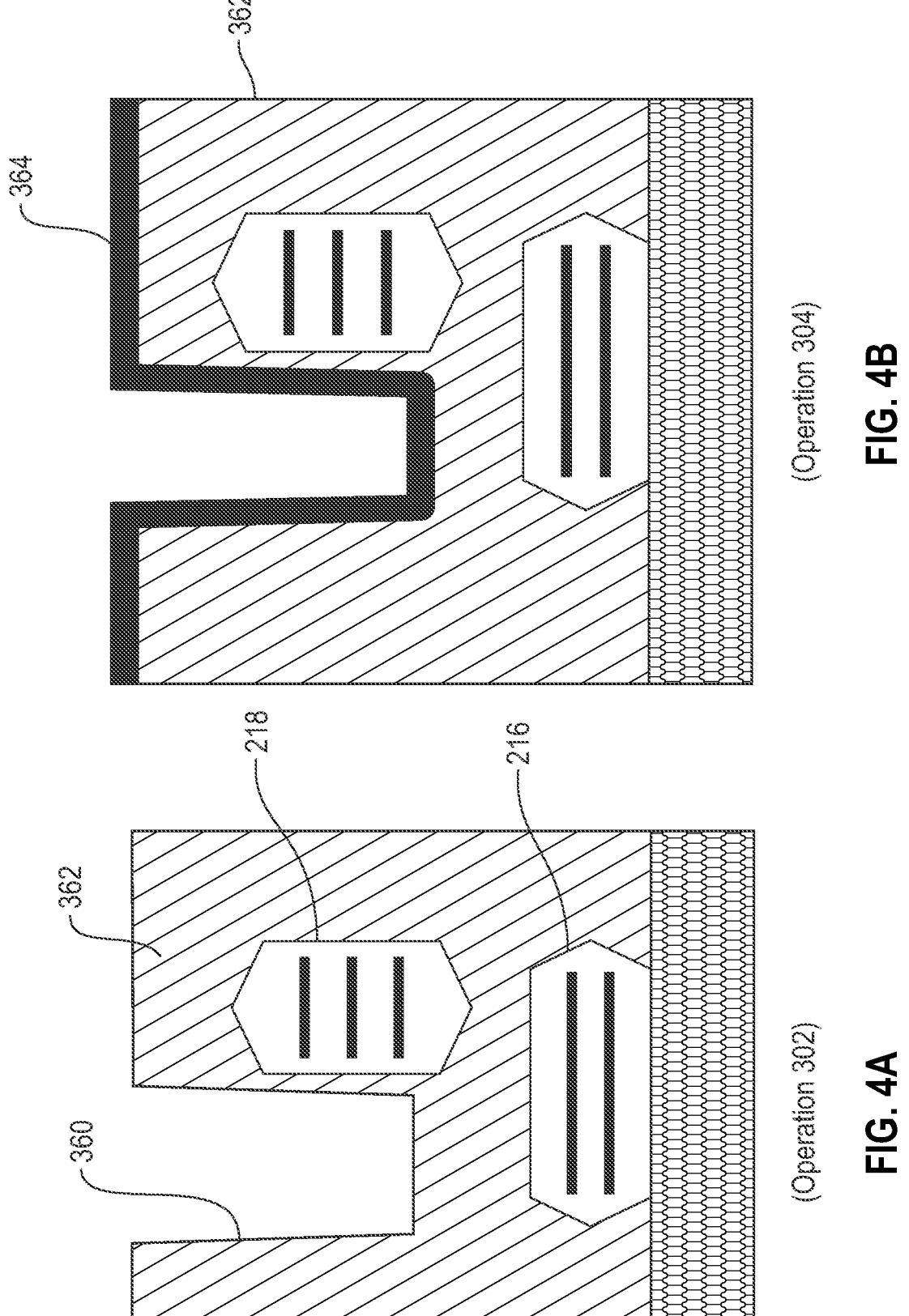
FIGS. 4A-4G are a series of cross-section views of the method of FIG. 3 of manufacturing the IC chip stack of FIG. 2, in accordance with an embodiment of the present disclosure.
Figure 4D:
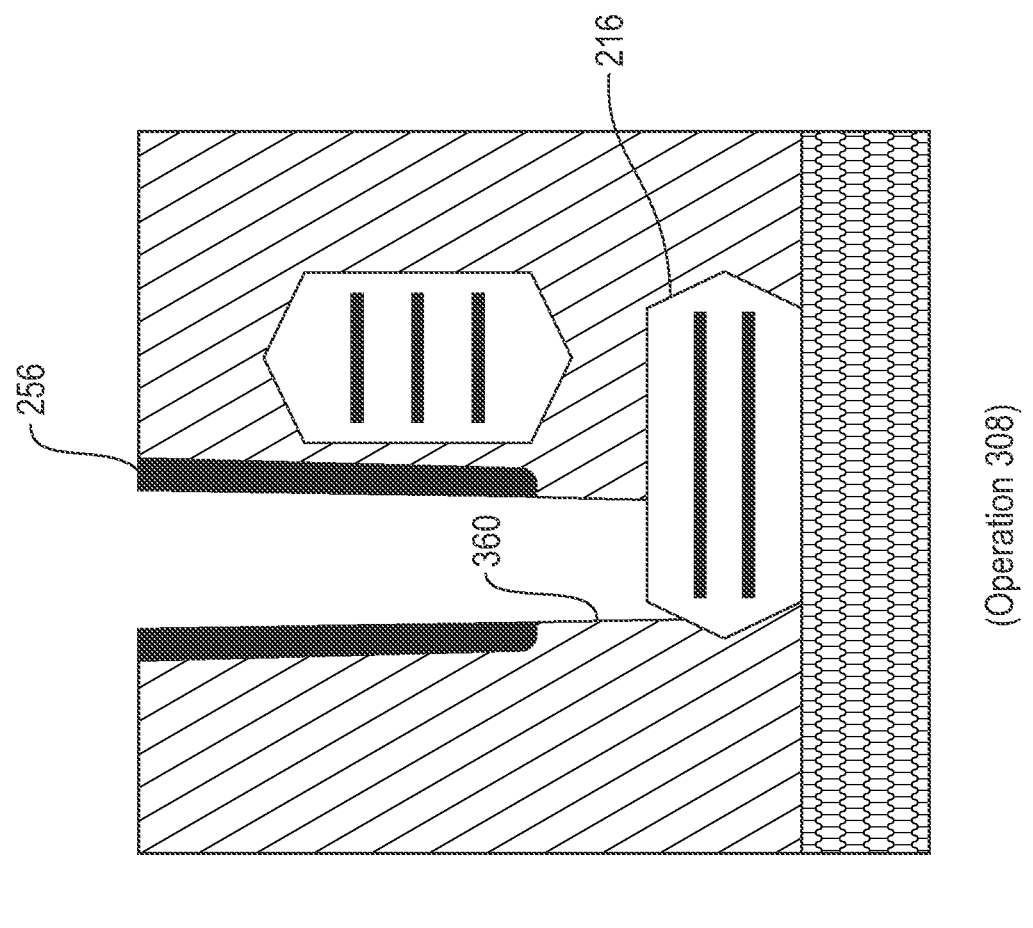
Figure 4C:
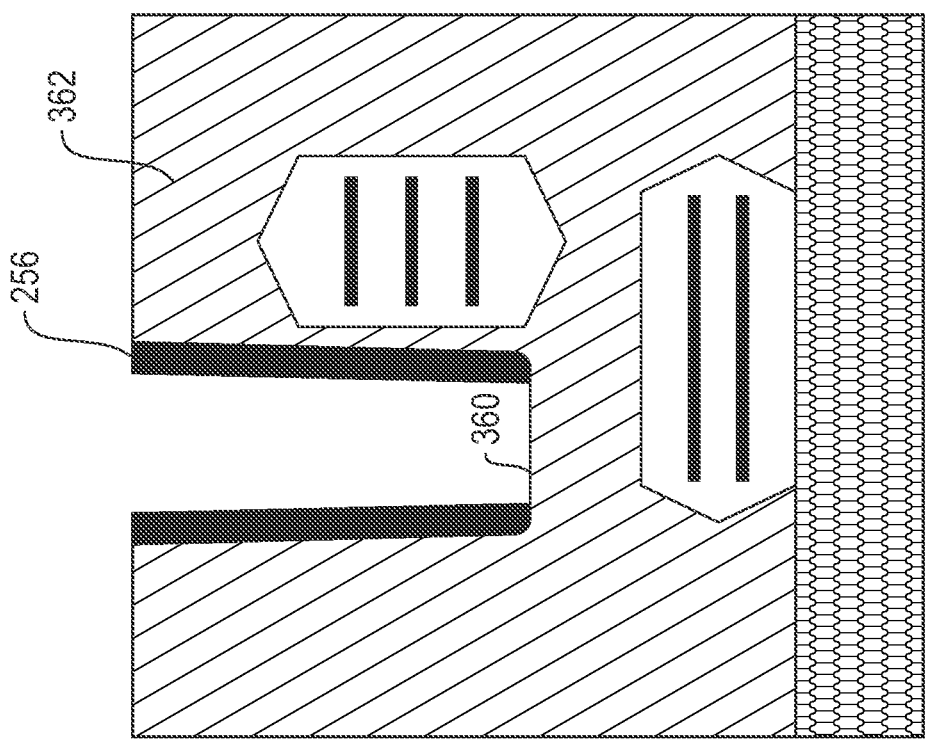
Figures 4E, 4F:
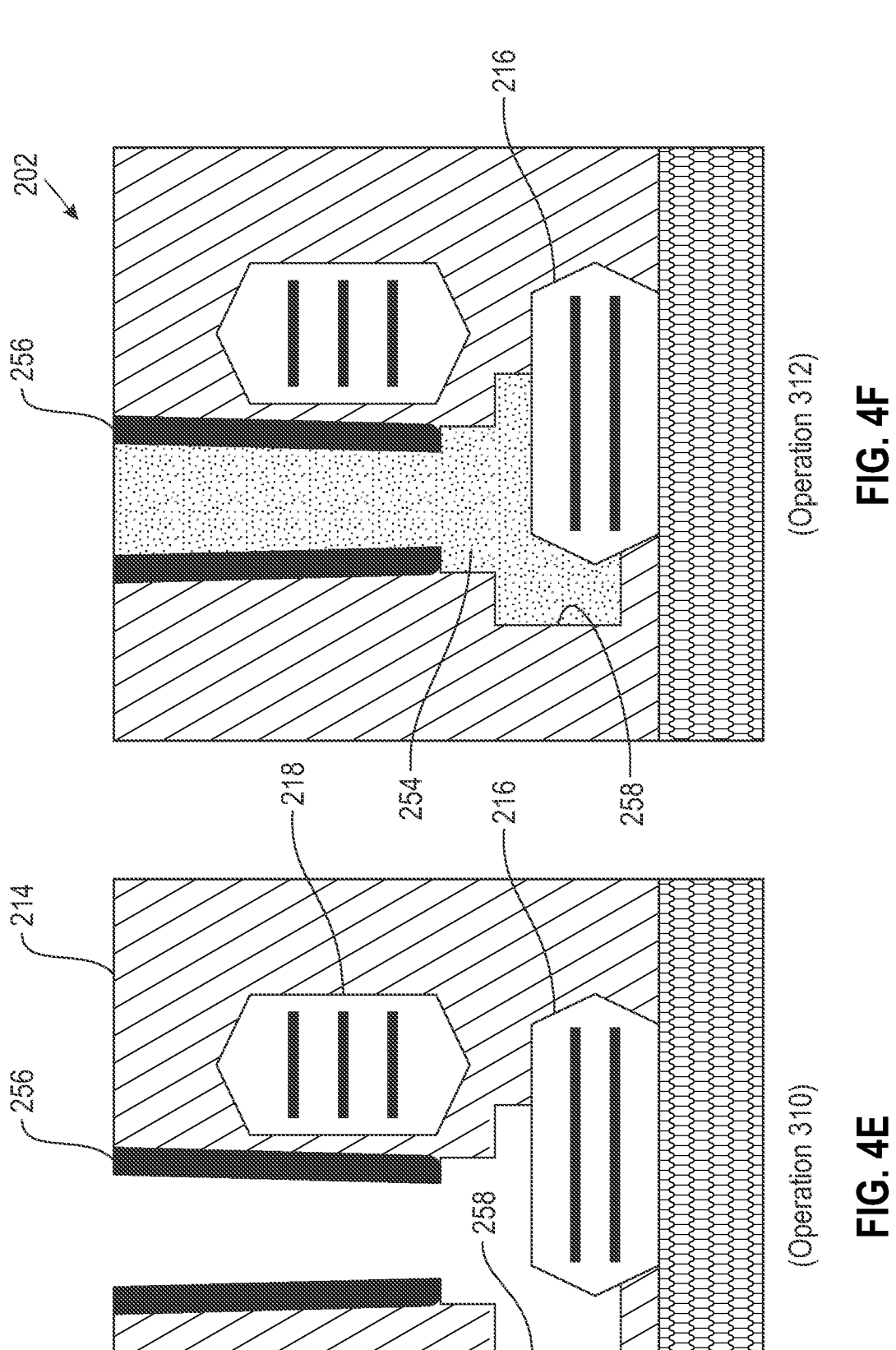
Figure 4G:
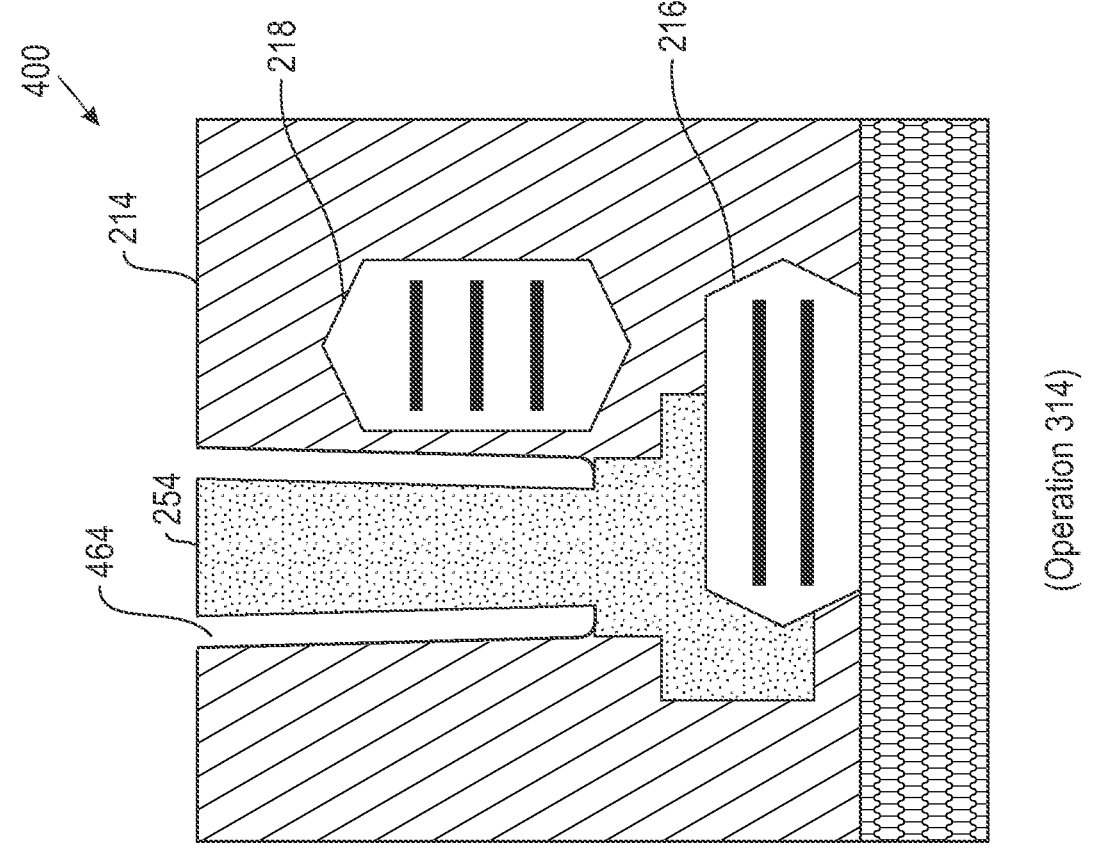

FIG. 3 is a flowchart of method 300 of manufacturing stack 200. FIGS. 4A-4G are a series of cross-section views of method 300 of manufacturing stack 200. FIGS. 3 and 4A-4G will now be discussed in conjunction with one another wherein each operation of method 300 is illustrated by one of FIGS. 4A-4G. In addition, during this discussion, references may be made to features of stack 200 shown in FIG. 2., however, some features may be omitted for the sake of simplicity.

In the illustrated embodiment, method 300 starts at operation 302, wherein pocket 360 is created in insulating layer 362 (which already includes NFET 216 and PFET 218) alongside but not exposing PFET 218. At operation 304, liner layer 364 is deposited on insulating layer 362. At operation 306, liner layer 364 is directionally etched to remove at least the portion at the bottom of pocket 360, exposing insulating layer 362 and forming liner 256.

In the illustrated embodiment, at operation 308, pocket 360 is deepened using an anisotropic removal method (e.g., a downward directional RIE). This exposes a small area of NFET 216 but it does not affect or remove NFET 216 or liner 256. At operation 310, pocket 360 is widened and deepened using an isotropic removal method. This forms insulator 214 and pore 258. It also exposes a larger area of NFET 216 along the top and down the side, but it does not affect or remove NFET 216 or liner 256. Such an operation can be influenced, for example, by the material or mixture of materials comprising insulator 214. While the isotropic removal method of operation 310 occurs after the anisotropic removal method of operation 308 in this embodiment, in other embodiments, operations 308 and 310 can exchange places in method 300. Furthermore, as shown in FIG. 5, both operations 308 and 310 can be anisotropic with one deepening pocket 360 and the other widening pocket 360 over at least a portion of NFET 216 and under at least a portion of PFET 218 (without exposing PFET 218).

In the illustrated embodiment, at operation 312, pore 258 and liner 256 are metalized to form via 254, which is connected to NFET 216. This completes the portion of stack 200 shown in FIG. 2. However, operation 314 can optionally be performed to remove liner 256 and expose insulator 214 and form IC chip stack 400 (hereinafter "stack 400"). Thereby, the "liner" in stack 400 is air gap 464, which, along with insulator 214, electrically insulates PFET 218 from via 254.

Figure 5:
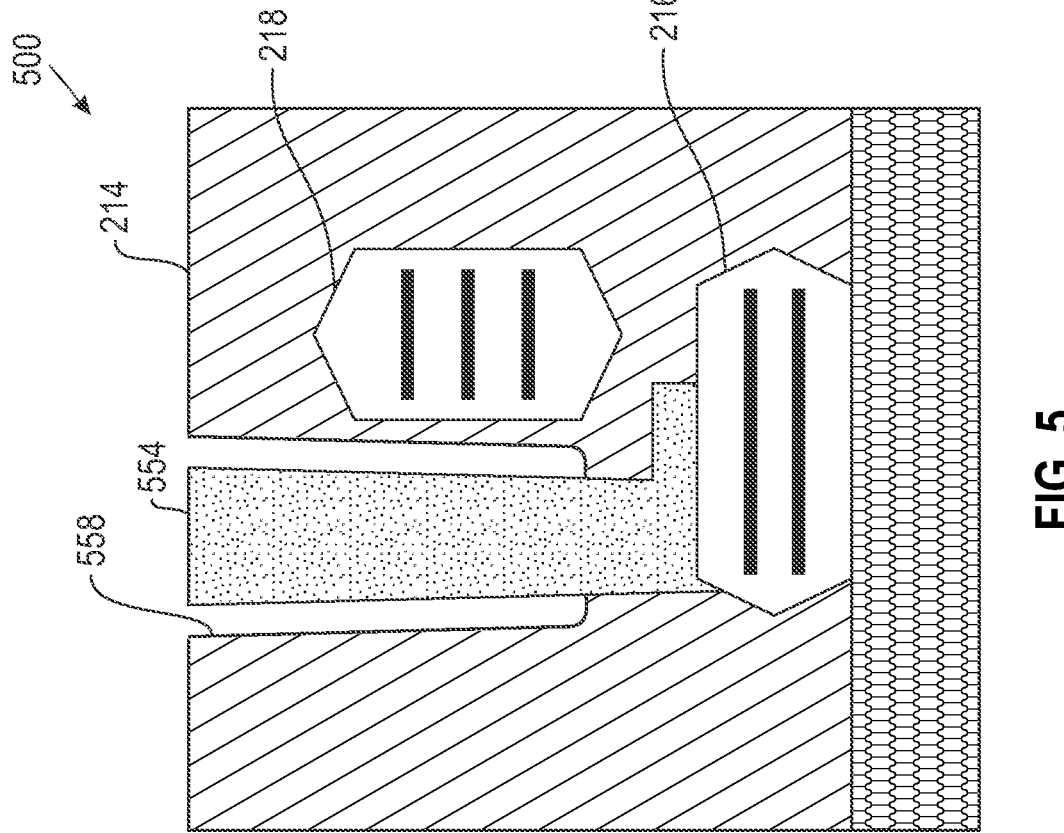
FIG. 5 is a cross-section front view of an alternative IC chip stack, in accordance with an embodiment of the present disclosure.

FIG. 5 is a cross-section front view of alternative IC chip stack 500 (hereinafter "stack 500"). Stack 500 is similar to stack 400, although there are also differences. For example, pore 558 and via 554 are L-shaped. As stated previously, this can occur by both operations 308 and 310 (shown in FIG. 3) being anisotropic removal processes. One of these processes primarily removes in a downward direction, and the other of these processes primarily removes in a lateral direction over NFET 216 (exposing NFET 216) and under PFET 218 (but not exposing PFET 218). In some embodiments, the lateral anisotropic removal process can include a tilted or angled plasma etch or angled ion bombardment etch that induces an asymmetric landing contact between via 554 and NFET 216. In some embodiments, an additional operation can be performed before the lateral removal process in which a dopant is implanted into insulator 214 to make portions of insulator 214 susceptible to the action of the lateral removal process.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device comprising:
a semiconductor wafer;
an insulator on the semiconductor wafer;
a first field effect transistor (FET) positioned in the insulator;
a second FET positioned in the insulator between the semiconductor wafer and the first FET;
a pore in the insulator that extends to and directly contacts the second FET;
a liner positioned within a top portion of the pore; and
a via that is positioned through the pore in direct contact with the liner at the top portion of the pore and in direct contact with the insulator at a bottom portion of the pore,
wherein the first FET is electrically insulated from the via by the insulator and the liner.

2. The semiconductor device of claim 1, wherein the liner is comprised of a low dielectric constant material.

3. The semiconductor device of claim 1, wherein the liner extends part way along the pore towards the second FET.

4. The semiconductor device of claim 3, wherein the liner extends past the first FET as it extends along the pore towards the second FET.

5. The semiconductor device of claim 1, wherein the via is L-shaped.

6. The semiconductor device of claim 1, wherein the via is shaped as a solid of revolution of an L-shape that is intersected by the second FET.

7. The semiconductor device of claim 1, wherein the second FET is a nanosheet n-channel FET (NFET), and the first FET is a nanosheet p-channel FET (PFET).

8. The semiconductor device of claim 1, wherein the insulator has a higher dielectric constant than the liner.

9. The semiconductor device of claim 1, wherein the liner is an air gap.

10. A semiconductor device comprising:
a semiconductor wafer;
an insulator on the semiconductor wafer;
a first nanosheet field effect transistor (FET) positioned in the insulator;
a second nanosheet FET positioned in the insulator between the semiconductor wafer and the first nanosheet FET;
a pore in the insulator that extends to a source/drain region of the second nanosheet FET;
a liner positioned within a top portion of the pore, wherein the liner is comprised of a low dielectric constant material and is shorter than the pore; and
a via connected to the source/drain region of the second nanosheet FET and positioned through the pore in direct contact with the liner at the top portion of the pore and in direct contact with the insulator at a bottom portion of the pore.

* * * * *